US012754026B2

(12) United States Patent
Berney-Dale et al.

(10) Patent No.: US 12,754,026 B2

(45) Date of Patent: Oct. 6, 2026

(54) VEHICLE CONTROL SYSTEM FOR DETERMINING JOURNEY SPEED

(71) Applicant: JAGUAR LAND ROVER LIMITED, Whitley (GB)

(72) Inventors: Graham Berney-Dale, Whitley (GB); Andrew Bradley, Whitley (GB)

(73) Assignee: JAGUAR LAND ROVER LIMITED, Coventry (GB)

( * ) Notice: Subject to any disclaimer, the term of this patent is extended or adjusted under 35 U.S.C. 154(b) by 139 days.

(21) Appl. No.: 18/683,213

(22) PCT Filed: Aug. 12, 2022

(86) PCT No.: PCT/EP2022/072634

§ 371 (c)(1),
(2) Date: Feb. 12, 2024

(87) PCT Pub. No.: WO2023/017144

PCT Pub. Date: Feb. 16, 2023

(65) Prior Publication Data

US 2024/0369368 A1 Nov. 7, 2024

(30) Foreign Application Priority Data

Aug. 13, 2021 (GB) ..................................... 2111652

(51) Int. Cl.
*G01C 21/34* (2006.01)
*G01R 31/36* (2020.01)

(52) U.S. Cl.
CPC ..... *G01C 21/3469* (2013.01); *G01C 21/3415* (2013.01); *G01R 31/36* (2013.01)

(58) Field of Classification Search
CPC . G01C 21/3469; G01C 21/3415; G01R 31/36
See application file for complete search history.

(56) References Cited

U.S. PATENT DOCUMENTS

2012/0109515 A1 5/2012 Uyeki et al.
2014/0236404 A1 8/2014 Liu et al.
(Continued)

OTHER PUBLICATIONS

Great Britain Intellectual Property Office, Combined Search and Examination Report Issued in Application No. GB2111652.0, Jun. 7, 2022, 10 pages.
(Continued)

*Primary Examiner* — Scott A Browne
*Assistant Examiner* — Terry C Buse
(74) *Attorney, Agent, or Firm* — McCoy Russell LLP

(57) ABSTRACT

A control system for a vehicle arranged to: receive route profile data indicative of a route between first and second locations; receive energy information indicative of an initial State of Charge of a power source of the vehicle prior to the vehicle travelling the route; calculate, using the energy information and the route profile data, a destination SoC of the power source of the vehicle at the second location; compare the destination SoC with a predetermined end-of-route SoC value; if the destination SoC is less than the predetermined end-of-route SoC value, determine a journey speed indicating an upper speed limit at which the vehicle may travel during at least a portion of the route and reach the second location with an SoC value equal to or greater than the predetermined end-of-route SoC value; and output the determined journey speed.

12 Claims, 8 Drawing Sheets

(56) References Cited

U.S. PATENT DOCUMENTS

| | | | | |
|---|---|---|---|---|
| 2019/0217724 | A1* | 7/2019 | Erb | B60K 6/48 |
| 2019/0219412 | A1* | 7/2019 | Melatti | G01C 21/3667 |

OTHER PUBLICATIONS

ISA European Patent Office, International Search Report and Written Opinion Issued in Application No. PCT/EP2022/072634, Nov. 14, 2022, WIPO, 10 pages.

* cited by examiner

1000

VEHICLE CONTROL SYSTEM FOR DETERMINING JOURNEY SPEED

CROSS REFERENCE TO RELATED APPLICATIONS

The present application is a U.S. National Phase of International Application No. PCT/EP2022/072634 entitled "ELECTRONIC VEHICLE ROUTE CALCULATOR," and filed on Aug. 12, 2022. International Application No. PCT/EP2022/072634 claims priority to Great Britain Patent Application No. 2111652.0 filed on Aug. 13, 2021. The entire contents of each of the above-listed applications are hereby incorporated by reference for all purposes.

TECHNICAL FIELD

The present invention relates generally to route calculation for electronic vehicles. In particular, but not exclusively, the invention relates to a speed at which an electronic vehicle may follow a route to a destination. Aspects of the invention relate to control systems for a vehicle, methods, systems, computer software, and computer readable media, and a vehicle.

BACKGROUND

Electronic vehicles (EVs) may provide route data during transit to a destination indicating, for example, a planned route to a destination, and metadata associated with the route such as an arrival time.

The provided metadata may be determined based on the an estimated or current usage of the EV while travelling the route. For example, metadata may include how fast the user is driving or how frequently to user accelerates and decelerates. During a route, if a user is driving in a manner such that the energy consumption of the EV is greater than expected, the user may receive a notification from the EV that a diversion in the route is necessary so that the user may charge the power source of the EV to try and ensure the EV has enough charge to reach a destination without running out. That is to say, EVs and energy usage determinations of EVs tend to be reactive to how they are used.

To some users, diverting during a route to stop the vehicle at charging station may be burdensome and undesired. Therefore, to help try and avoid having to divert during a route to a charging station, a user may choose to limit their speed so that the power requirement of the power source while travelling the route is reduced. However, at present, a means to determine a speed for travelling a route that delivers the EV to the destination in as short a time as possible whereby the speed also conserves the power source of the EV as much as possible is not provided. That is to say, a user may reduce their speed based on their estimations to conserve remaining power of the power supply, but the user is unaware of an optimal speed at which they may travel for their journey while conserving power.

Thus there is a need for a control system able to provide a preventative method to try and ensure that an EV may be driven to a destination without requiring charging, if possible, for example by indicating a driving parameter (e.g. speed) for the user to abide by before the user has started their journey.

It is an object of examples disclosed herein to at least mitigate one or more of the problems of the prior art.

SUMMARY

Aspects and embodiments of the invention provide control systems, methods, systems, a vehicle, and computer software as claimed in the appended claims.

According to an aspect, there is provided a control system for a vehicle, the control system comprising one or more controllers, the control system arranged to:

receive route profile data indicative of a route between a first location and a second location;

receive energy information indicative of an initial State of Charge, SoC, of a power source of the vehicle prior to the vehicle travelling the route;

calculate, using the energy information and the route profile data, a destination SoC of the power source of the vehicle at the second location;

compare the destination SoC with a predetermined end-of-route SoC value;

if the destination SoC is less than the predetermined end-of-route SoC value, determine a journey speed for the vehicle, the journey speed indicating an upper speed limit at which the vehicle may travel during at least a portion of the route and reach the second location with a SoC value equal to or greater than the predetermined end-of-route SoC value; and output the determined journey speed.

The one or more controllers may collectively comprise:

at least one electronic processor having an electrical input for receiving the energy information for the vehicle; and at least one memory device electrically coupled to the at least one electronic processor and having instructions stored therein;

and wherein the at least one electronic processor is arranged to access the at least one memory device and execute the instructions thereon so as to:

receive route profile data indicative of a route between a first location and a second location;

receive energy information indicative of an initial State of Charge, SoC, of a power source of the vehicle prior to the vehicle travelling the route;

calculate, using the energy information and the route profile data, a destination SoC of the power source of the vehicle at the second location;

compare the destination SoC with a predetermined end-of-route SoC value;

if the destination SoC is less than the predetermined end-of-route SoC value, determine a journey speed for the vehicle, the journey speed indicating an upper speed limit at which the vehicle may travel during at least a portion of the route and reach the second location with a SoC value equal to or greater than the predetermined end-of-route SoC value; and output the determined journey speed.

When determining the journey speed for the vehicle, the control system may be arranged to:

determine an available energy of the power source based on the initial SoC and the route profile data;

determine a route distance based on the route profile data; and determine the journey speed for the vehicle based on the available energy of the power source and the route distance.

When determining the available energy of the power source, the control system may be arranged to:

divide the route profile data into a plurality of route segments; and determine an energy associated with each route segment of the plurality of route segments based on the route profile data.

When determining the energy associated with each route segment, the control system may be arranged to:

determine a tractional energy required to travel the route segment, wherein the tractional energy is determined based on a speed energy and an elevation change energy associated with the route segment.

When determining the energy associated with each route segment, the control system may be arranged to, one or more of:

determine a non-tractional energy for each of the plurality of route segments for the power source of the vehicle based on the route profile data; and determine an energy required for a user-set comfort level of the vehicle based on one or more of the route profile data and a user profile, the user-set comfort level indicating a vehicle feature setting.

The control system may be arranged to:

determine the journey speed using a predetermined mapping indicating a relationship between the journey speed, the available energy of the power source and the route distance.

The control system may be arranged to:

if the destination SoC is less than the predetermined end-of-route SoC value and the determined journey speed is less than a lower journey speed bound value for at least a part of the route, output an indication of insufficient remaining battery energy to perform the route.

The indication of insufficient remaining battery energy to perform the route comprises one or more of: an amended route to include one or more charging stops; a new route between the first location and the second location without any charging stops; and an indication that the vehicle requires charging before departing from the first location.

When amending the route to include one or more charging stops, the control system may be arranged to:

determine a first charging point based on the predetermined end-of-route SoC value;

determine a second charging point based on the lower journey speed bound value;

determine whether the first charging point and the second charging point are the same charging point; and provide an indication of the determined charging point based on the determination.

If the first charging point is the same as the second charging point, the control system is arranged to:

amend the route profile data to further comprise the first charging point.

If the first charging point is not the same as the second charging point, the control system is arranged to:

amend the route profile data to further comprise the second charging point; and determine an amended journey speed for the vehicle using the amended route profile data.

The control system may be arranged to:

determine a second destination SoC based on the energy information and the amended route profile data; and if the second destination SoC is less than the predetermined end-of-route SoC value, determine an alternative first charging point based on the predetermined end-of-route SoC value and an alternative second charging point based on the lower journey speed bound value.

The control system may be arranged to:

if the destination SoC is greater than or equal to the predetermined end-of-route SoC value and the determined journey speed is greater than or equal to the lower journey speed bound value, compare the route data with a route preference setting; and determine a route to travel from the first location to the second location based on the route preference setting.

The journey speed may indicate the upper speed limit at which the vehicle may travel within a current segment of the route and reach the second location without requiring a charging stop during travel.

The route profile data may comprise information indicative of at least one from a group comprising:

elevation gain along the route;

elevation loss along the route;

distance along the route;

average speed of the route segments;

traffic conditions along the route;

weather conditions along the route;

time at which a point of the route is planned to be reached; and speed of travel along the route.

In some examples, the vehicle may be an electric vehicle and the power source may be a battery. In some examples, the vehicle may be a hybrid vehicle and the power source may be a battery and a petrol or diesel engine.

According to another aspect of the invention, there is provided a vehicle comprising any control system, or system disclosed herein.

According to another aspect of the invention, there is provided a method comprising:

receiving route profile data indicative of a route between a first location and a second location;

receiving energy information indicative of an initial State of Charge, SoC, of a power source of a vehicle prior to the vehicle travelling the route;

calculating, using the energy information and the route profile data, a destination SoC of the power source of the vehicle at the second location;

comparing the destination SoC with a predetermined end-of-route SoC value;

if the destination SoC is less than the predetermined end-of-route SoC value, determining a journey speed for the vehicle, the journey speed indicating an upper speed limit at which the vehicle may travel during at least a portion of the route and reach the second location with an SoC value equal to or greater than the predetermined end-of-route SoC value; and outputting the determined journey speed.

According to another aspect of the invention, there is provided computer software, which, when executed, is arranged to perform any method disclosed herein.

According to another aspect of the invention, there is provided a non-transitory, computer-readable storage medium storing instructions thereon that, when executed by one or more electronic processors, causes the one or more electronic processors to carry out any method disclosed herein.

Within the scope of this application it is expressly intended that the various aspects, examples and alternatives set out in the preceding paragraphs, in the claims and/or in the following description and drawings, and in particular the individual features thereof, may be taken independently or in any combination. That is, all examples and/or features of any example can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

Examples will now be described by way of example only, with reference to the accompanying figures, in which.

DETAILED DESCRIPTION

Figure 1:
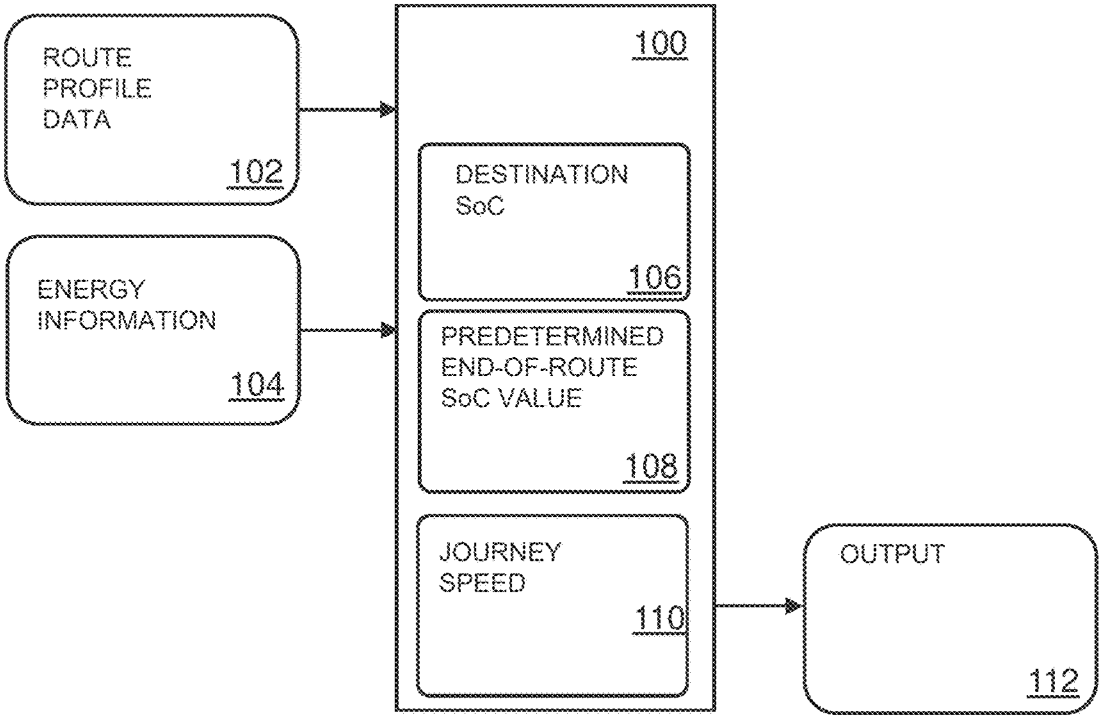
FIG. 1 shows an example control system according to examples disclosed herein.
Figure 10:
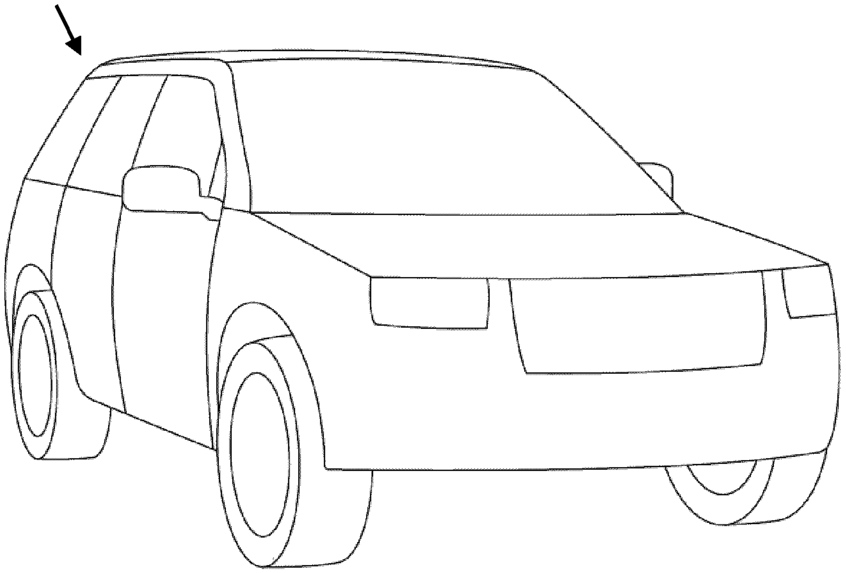
FIG. 10 shows a vehicle according to examples disclosed herein.

FIG. 1 shows a control system 100 for a vehicle (e.g. vehicle 1000 of FIG. 10). The control system 100 may be a navigation application system, which stores data on a storage medium, and/or manages data (e.g. data stored on a storage in communication with the control system 100). The stored/managed data may be map data, route data (e.g. elevation changes), and/or charging point location data. The control system 100 may also be used as an energy storage control system, which stores on a storage and/or manages data such as battery information, vehicle data, consumption behaviour, motor losses, non-tractive loading data, and/or user profile comfort settings. The control system 100 may be considered to handle navigation-related data and vehicle-related data, and may control vehicle data for a current state of a vehicle. While illustrated in FIG. 1 as a single control system, the control system 100 may comprise one or more control systems in communication with each other. For example, the control system 100 may comprise a navigation-type control system and a separate energy storage control system in communication with the navigation-type control system.

The control system 100 comprises one or more controllers (see for example FIG. 5) and is arranged to receive route profile data 102. The route profile data 102 is indicative of a route between a first location and a second location. The route profile data 102 may be received from a local memory (see for example FIG. 5) or from a remote resource (e.g. cloud storage or a remote server). The route profile data 102 may comprise information indicative of, for example, elevation gain along the route; elevation loss along the route; distance along the route; average speed of the route segments; traffic conditions along the route; weather conditions along the route; time at which a point of the route is planned to be reached; speed of travel along the route; and/or a "flow" speed of travel along the route. The term flow speed may be understood as an estimate of the current speed of traffic along the route and/or a segment of the route, taking account of factors such as: the average historical speed; traffic conditions (e.g. quiet, busy, roadworks); weather conditions; day of the week; the time of day and/or live reporting from a vehicle currently travelling on a segment of the route (e.g. via "vehicle-to-everything" (V2X) (e.g. "vehicle-to-vehicle" (V2V), "vehicle-to-infrastructure" (V2I)) communication). For example, a flow speed may be determined based on whether a route segment is on a motorway (using average historical speed) with roadworks planned thereon (using traffic conditions), in wet conditions (using weather conditions) at 11:00 am on a Saturday (using time of day and day of the week, respectively). The first location and the second location may respectively be the starting location of a journey (e.g. a vehicle user's home) and the destination location of the journey (e.g. car park of a tourist attraction) in some examples. As another example, the first location and second location may be respective interim locations (e.g. a charging station or a convenience store) on a route from a starting location to a destination location. Therefore, the route represented by the route profile data 102 may be: a journey from the starting location to the destination location; a journey from the starting location to an interim location; a journey from an interim location to an interim location; or a journey from an interim location to the destination location.

The control system 100 is arranged to receive energy information 104. The energy information 104 is indicative of an initial State of Charge, SoC, 104*a* of a power source of the vehicle prior to the vehicle travelling the route. The energy information 104 may be received from a local memory (see for example FIG. 5). In some examples, the power source of the vehicle may be one or more energy storage means (e.g. battery or capacitor). The term "State of Charge" may be understood to relate to the amount of energy stored in the power source of the vehicle and may be represented as a percentage, for example. In some examples, the SoC may be determined by comparing a current available capacity of the power source with the maximum capacity possible for the power source. In some examples the capacity of the power source may be measured in watt-hours (Wh), kilowatt-hours (kWh), and/or ampere-hours (Ahr).

The control system 100 is arranged to calculate a destination SoC 106 of the power source of the vehicle at the second location. The destination SoC is calculated using the energy information 104 and the route profile data 102. For example, the control system 100 may be arranged to determine an expected tractional energy and expected ancillary load for travelling the route. The control system 100 may be arranged to determine the expected tractional energy by using the total route length to split the route into a plurality of fragments and determine an expected energy consumption of each fragment of the plurality of fragments using, for example: an average journey speed for each fragment (using historical data and/or live traffic data), the time expected to travel each fragment, and the amount of ascent and descent for each fragment, as well as using a historical energy consumption for each fragment. The control system 100 may be arranged to determine the expected ancillary load using, for example, an initial state of heating, ventilation and air conditioning requirements (HVAC), and a desired state of HVAC (e.g. how much energy is required to transition to and maintain the desired HVAC state when transitioning from the initial HVAC state). As another example, the control system 100 may use a current SoC, an overall route distance, elevation changes during the route from the first location to the second location, and/or a live traffic status of roads included in the route from the first location to the second location to calculate the destination SoC. As yet another example, the control system 100 may determine a net elevation, a total route length and obtain live traffic status, and calculate an estimate of how much energy may be required for the vehicle to travel the route.

The control system 100 is arranged to compare the destination SoC with a predetermined end-of-route SoC value 108. The value of the predetermined end-of-route SoC value may be set by the user of the vehicle or the control system 100. The predetermined end-of-route SoC value may represent a minimum SoC value that the user is comfortable to arrive at a second location with remaining in the power source of the vehicle. The value predetermined end-of-route SoC value may be determined based on a determination of a specific user driving the vehicle (e.g. a user of the vehicle having a user profile having a specific predetermine end-of-route SoC value stored setting therefor). For example, a particular user may not wish the power level of the battery of the EV to be less than 15% upon arrival as the destination, for example if they are unsure if they would be able to recharge the power source at the destination. As another example, if the user is aware there is a power charging facility available at the destination, they may be happy to arrive with a minimum 5% battery power, knowing that the power source can be recharged on arrival.

The control system 100 is arranged to, if the destination SoC is determined to be less than the predetermined end-of-route SoC value, determine a journey speed 110 for the vehicle. In some examples, the determined journey speed may indicate an upper speed limit at which the vehicle may travel during at least a portion of the route and reach the second location with the an SoC value equal to or greater than the predetermined end-of-route SoC value. In some examples, the determined journey speed may indicate the upper speed limit at which the vehicle may travel within a current segment of the route and reach the second location without requiring a charging stop during travel. Determining the journey speed will be discussed further in relation to FIGS. 2-3. The upper speed limit may be determined and suggested for the user to try to ensure that the user is able to arrive at the second location with at least the predetermined end-of-route SoC value, without requiring a charging stop en-route. In contrast, if a speed greater than the upper speed limit is maintained, the energy stored in the power source of the vehicle may not be sufficient for the vehicle to arrive at the second location with at least the predetermined end-of-route SoC value, because maintaining a speed higher than the upper speed limit may require more energy usage per unit distance. For example, a vehicle travelling at 70 mph may use the stored energy of the power source of the vehicle at a faster rate per unit distance than if the vehicle travelling at an upper speed limit of 65 mph.

The control system 100 is arranged to output 112 the determined journey speed. The control system 100 may output the journey speed as, for example, an audio output and/or a visual output. For example, the control system 100 may output to the user "Stay below 50 mph to reach your destination with 7% SoC", as an audio message, or displayed on an in-vehicle display screen. In some examples, the determined journey speed may be output to the user of the vehicle before commencement of the journey from the first location to the second location. In this way, the user is aware of how they can limit their speed to try to ensure they arrive at the second location with a SoC that meets the predetermined end-of-route SoC value before setting out on their journey (i.e. the journey speed is a parameter of the route from the first location to the second location). In some examples, the determined journey speed may be output during the journey from the first location to the second location as a live updated journey speed (e.g. as a speed limit during a period of restriction), for example in respect of the remaining portion of the overall journey.

Figure 2:
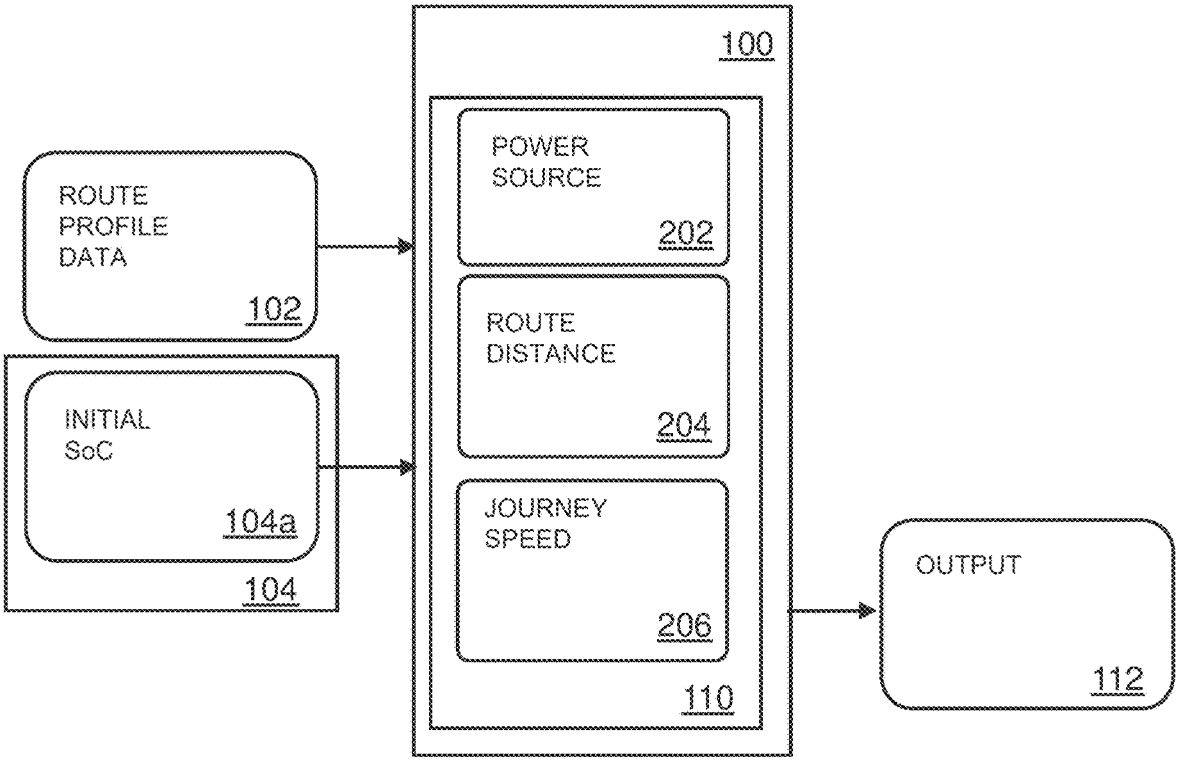
FIG. 2 shows an example control system according to examples disclosed herein.

FIG. 2 also shows a control system 100 for a vehicle and further illustrates how the journey speed may be determined. The control system 100 may be arranged to determine an available energy of the power source 202 based on the initial SoC 104*a* and the route profile data 102; determine a route distance 204 based on the route profile data 102; and determine the journey speed for the vehicle 206 based on the available energy of the power source and the route distance. In some examples, the control system 100 may be arranged to determine the journey speed using a predetermined mapping indicating a relationship between the journey speed, the available energy of the power source of the vehicle, and the route distance (e.g. as illustrated in FIG. 6*d*). The predetermined mapping indication a relationship will be discussed in further detail in relation to FIG. 6*d* below.

Figure 3:
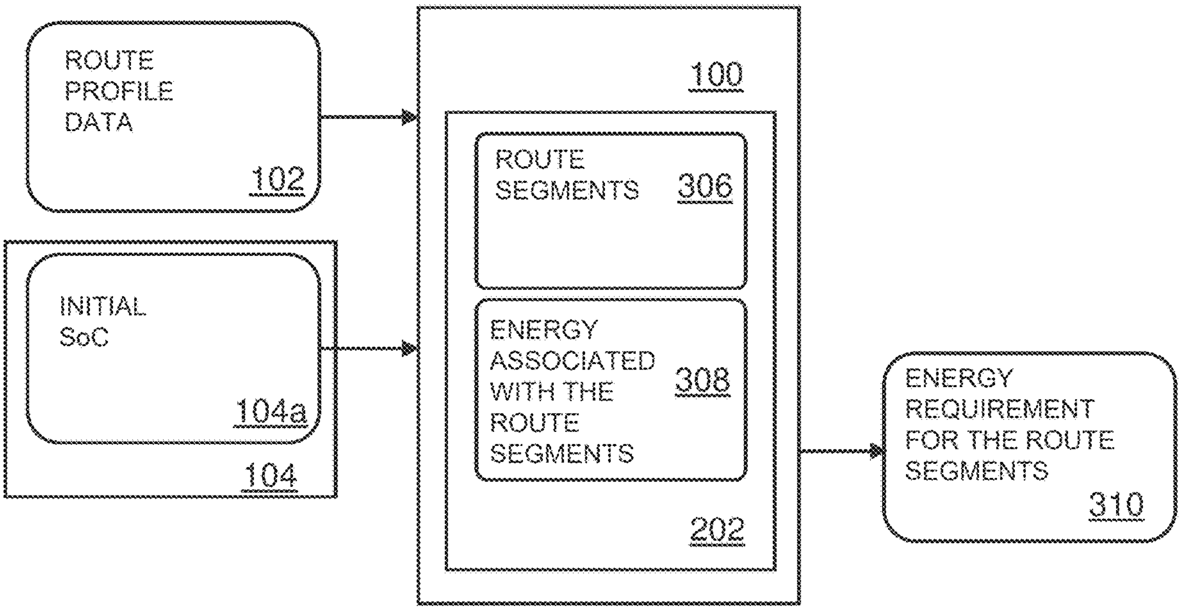
FIG. 3 shows an example control system according to examples disclosed herein.

FIG. 3 shows a control system 100 for a vehicle and illustrates how the available energy of the power source 202 may be determined. When determining the available energy of the power source 202, the control system 100 may be arranged to divide the route profile data 102 into a plurality of route segments 306. In some examples, the control system 100 may divide the route profile data 102 based on the content of the route profile data 102. For example, the route profile data 102 may indicate a total route length and the control system may divide the route profile data 102 into a number of segments of equal length. This is discussed in greater detail below in relation to FIG. 4. The control system 100 may be arranged to then determine an energy associated with each route segment of the plurality of route segments 308 based on the route profile data 102.

Figure 4:
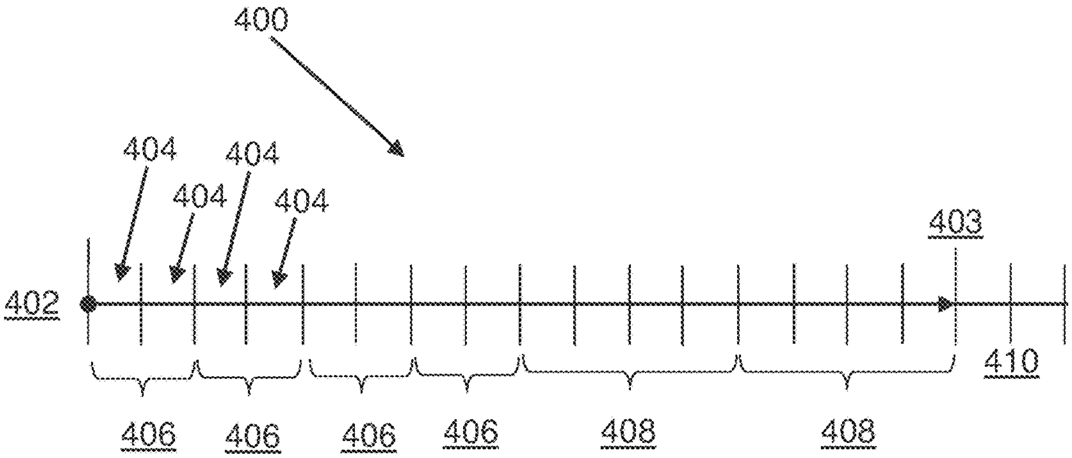
FIG. 4 shoes an example of fragmented route data, and how a combination of those fragments form route data.

An example of a route profile data 102 divided into a plurality of route segments is illustrated in FIG. 4. FIG. 4 illustrates a route, represented by route profile data 400, having a first location 402 and a second location 403. In this schematic example, the route profile data 400 is divided into equal length route segments 404 (as also shown, for example, by the 5 km increments along the x-axis of FIGS. 6*a-c*, indicating the equal length route segments 404). In some examples, a first portion of the route segments 404 are grouped into at least one first route group 406 (in this example, four first route groups 406 are formed each of two route segments 404). In some examples, a second portion of the route segments 404 are grouped into at least one second route group 408 (in this example, two second route groups 408 are formed each of four route segments 404). These second route groups 408 are each longer than the first route groups 406. By including first route groups 406 nearer to the vehicle which are of a length shorter than the second route groups 408, approximations of speed and expected SoC, for example, are biased towards greater accuracy nearer to the vehicle. For example, if the power source of the vehicle is drained before the end of the full profile, the data after the point of full battery drainage is not required or useful.

The control system 100 may be arranged to determine an energy associated with each route segment of the plurality of route segments 406 based on the route profile data 102. The energy associated with each route segment 406 may be understood to be an energy requirement for vehicle to travel along the route segment 406. In some examples, the control system 100 may be arranged to, when determining the energy associated with each route segment 406, determine a tractional energy required to travel the route segment 406.

The tractional energy required may depend on, for example, the overall route (e.g. the length of the overall route), the route segment 406 (e.g. the length of the route segment 406), route segment 406 characteristics (e.g. gradients, the amount of ascent or descent per segment), the time taken to traverse each route segment, and/or a flow speed of the segment (e.g. which may be based on a live traffic status), comprised within the route profile data 102. In some examples, the tractional energy may be determined based on a speed energy (e.g. the amount of energy required to travel a unit distance at a particular speed) and/or an elevation change energy (i.e. the amount of energy required to change elevation by a given unit) associated with the route segment 406.

The term "speed energy" may be understood in some examples as the amount of energy required to propel the vehicle at a certain speed along a route segment 406. In some examples, said certain speed may be equal to the flow speed of the route segment 406. In other examples, said certain speed may be equal to a user set or system set speed (e.g. a speed to be associated with a current user profile).

The term "elevation change energy" may be understood as an energy required and/or (re) gained due to changes in elevation during travelling of a route segment 406 (i.e. taking into account the topology of a route segment 406). In some examples, elevation change energy may be determined based on the route segment 406 characteristics, as discussed above. In some examples a route segment 406 may comprise positive gradients for extended periods of time, requiring an increased amount of energy from the power source of the vehicle compared with a flat segment of equivalent length. In some examples, a route segment 406 may comprise negative gradients for extended periods of time, enabling regeneration/regaining of stored energy in the power source of the vehicle (e.g. using regenerative braking).

The control system 100 may also be arranged to, when determining the energy associated with each route segment 406, determine a non-tractional energy and/or an energy required for a comfort level of the vehicle. A non-tractional energy may be understood as energy required for the vehicle that is not concerned with propelling the vehicle through a route segment 406 (e.g. the energy required for: lights of the vehicle (e.g. driving lights, headlights, brake lights etc); engine control units (ECUs) of the vehicle; powering windscreen wipers; powering displays etc.). An energy required for a comfort level of the vehicle may be understood as the energy required to regulate the internal environment of the vehicle (e.g. climate control, heated seats etc.). In some examples, the comfort level of the vehicle may be set during the route and/or may be initially set in accordance with a user profile associated with a user identified to be driving and/or present in the vehicle.

In some examples, the control system 100 may determine the available energy of the power source based on the energy associated with each route segment 406 and the initial SoC 104*a* of the vehicle (e.g. it may determine a summation/running total of the energy associated with each of the route segments 406 and compare the summation with the energy associated with the initial SoC 104*a* of the vehicle).

In some examples, the control system 100 may determine the journey speed using a predetermined mapping. The predetermined mapping may be stored in a storage in communication with the control system 100. The predetermined mapping may indicate a relationship between the journey speed, the energy available of the power source and the route distance. In some examples, a maximum consumption rate may be determined based on the energy available of the power source and route distance. In some examples, the mapping may indicate the relationship between the journey speed and the energy available of the power source and the route distance as a mapping between the journey speed and a maximum consumption rate (e.g. see FIG. 6*d*, discussed below). The term "maximum consumption rate" may be taken to indicate a maximum consumption rate that the vehicle may use during the route to arrive at the second location with a SoC value that is equal to or greater than the predetermined end-of-route SoC value.

In some examples, the mapping is determined based on a lab testing of a production specification vehicle and/or computer simulation(s) of a model vehicle. For example, the production vehicle may be propelled at a number of different speeds, and the consumption rate associated with the respective speeds may be determined. In some examples, the mapping may be determined for each individual vehicle, thereby providing a respective relationship between journey speed, energy available of the power source, and the route distance for each individual vehicle. The mapping may be determined for each individual vehicle because performance between each individual vehicle may vary within a manufacturer tolerance.

Figure 6A:
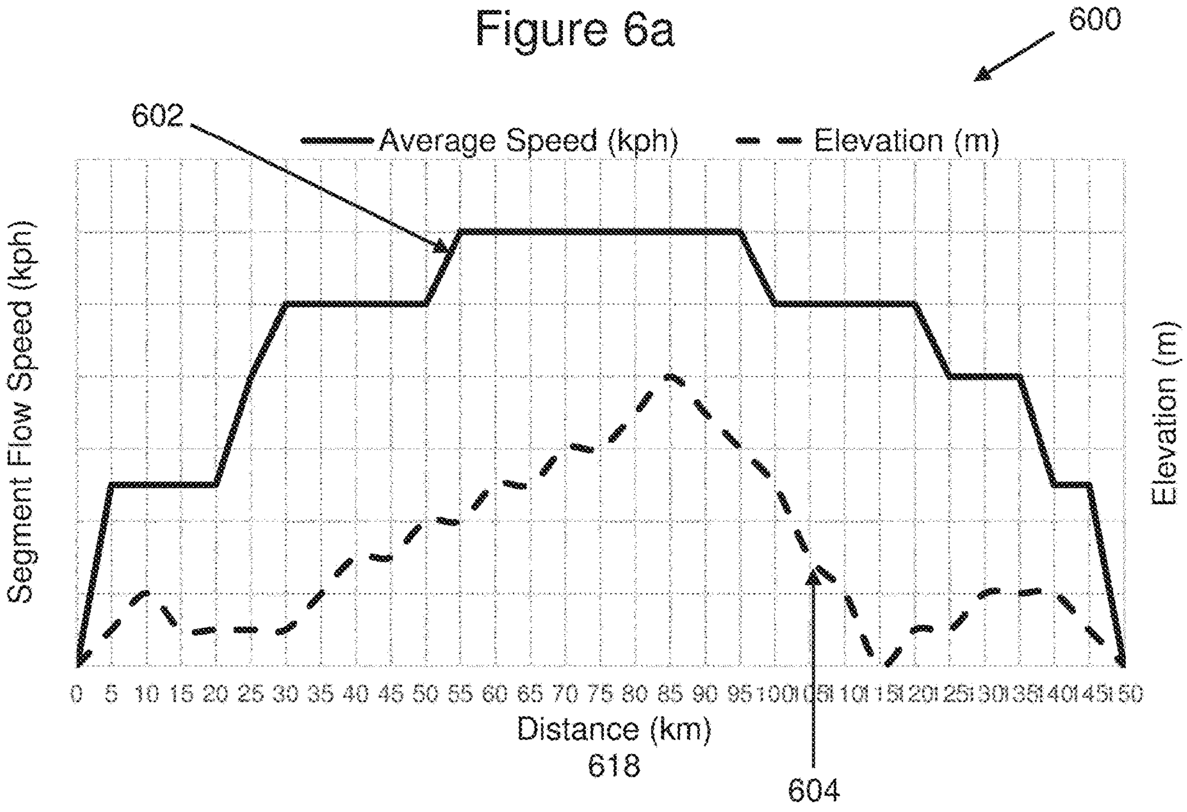
FIG. 6*a*-6*d* show an illustrative example of calculating a journey speed for the vehicle according to examples disclosed herein.
Figure 6B:
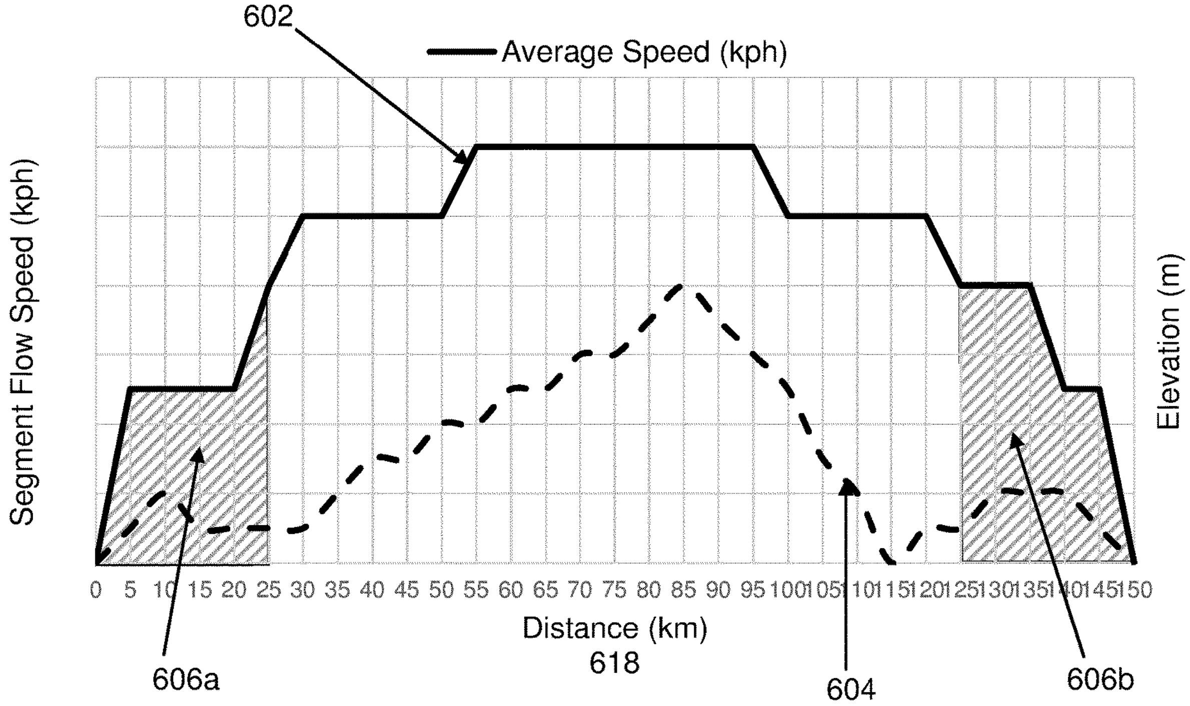

FIG. 6*a* shows an illustrative example of calculating a journey speed for the vehicle according to an example. FIG. 6*a* shows a plot 600 of a route average speed/flow speed 602 overlaid with an elevation/topology profile 604 of the route against the route distance 618. The flow speed 602, the elevation/topology profile 604, and route distance may be comprised within the route profile data 102, as disclosed above, and may be used to determine the aforementioned speed energy and elevation change energy associated with each route segment 406. In FIG. 6*a*, the route segments 406 may be of equal length (e.g. 5 km).

Figure 6C:
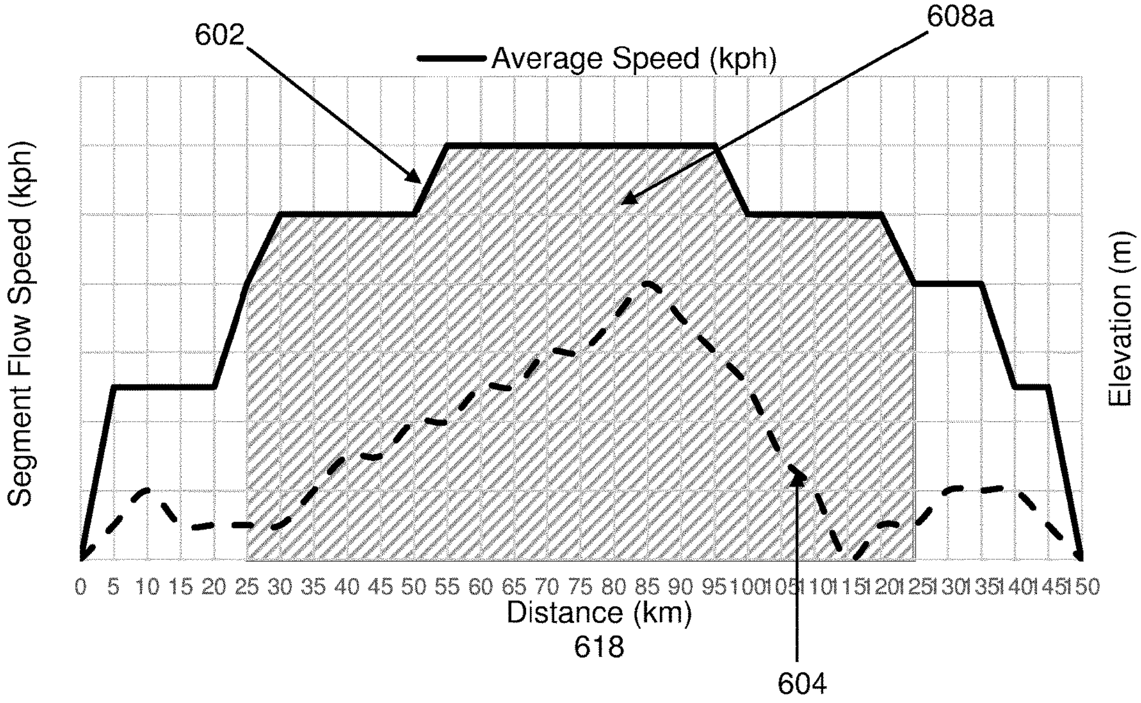
Figure 6D:
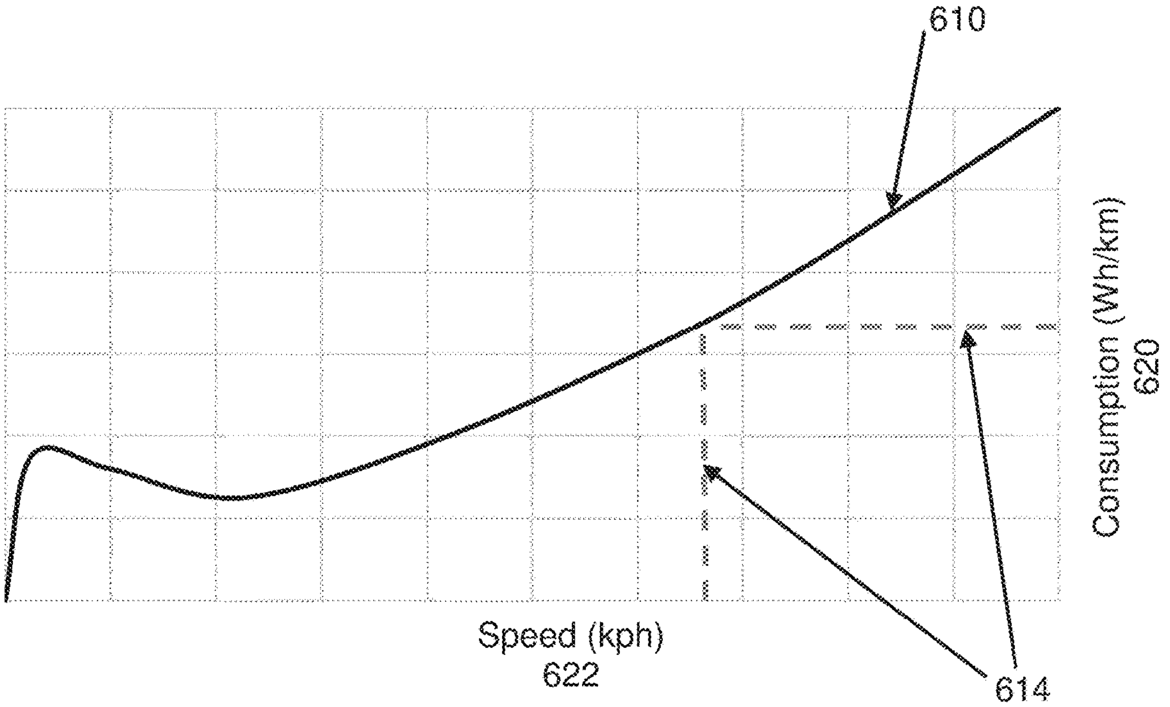

In some examples, the control system 100, may impose conditions when determining the available energy of the power source based on the initial SoC 104*a* and the route profile data 102. For example, the control system 100 may, when the flow speed 602 of a route segment 406 is less than or equal to a lower journey speed bound value, add the tractional energies due to the speed energy associated with the route segment 406 to a running total of required energy. For example, in FIG. 6*b*, the lower journey speed bound value may be set to 50 mph (by a user or the control system 100, for example) and therefore route segments 406 included in regions 606*a*, 606*b* having a journey speed below the lower journey speed bound value may be accounted for in the running total of required energy. Also in this example, as shown in FIG. 6*c*, the control system 100 may, when the flow speed 602 of a segment is greater than the lower journey speed bound value, add the tractional energies due to the elevation change energy associated with the route segment to the running total of required energy. As shown in FIG. 6*c*, the route segments 406 included in regions 608 may be accounted for in the running total of required energy. During all regions 606*a*, 606*b*, 608, the control system 100 may determine the non-tractional energy and the energy required for a comfort level for each route segment 406 and add the non-tractional energy and the comfort level energy to the running total of required energy. The control system 100 may then carry out determining the journey speed based on the determined available energy and the route distance, as disclosed above.

FIG. 6*d* shows an example mapping 610 between the journey speed 622, the available energy of the power source and the route distance (the available energy and route distance being expressed as a maximum consumption rate 620). In some examples, the control system 100 may use a determined maximum consumption rate to determine an associated journey speed of the vehicle (as represented by the dotted lines 614 indicating a speed corresponding to a particular energy consumption). In some examples, the mapping 610 may be stored in a storage in communication with and/or comprised within the control system 100. In some examples, the mapping 610 may be stored in the form of a look-up table. For example, the control system 100 may search the look-up table for the closest consumption value to the determined maximum consumption rate and determine the corresponding journey speed. In some examples, the control system 100 may be arranged to, when searching the look-up table, interpolate or extrapolate between entries. For example, if a determined maximum consumption rate is not equal to, but lies in between, two maximum consumption rate entries in the look-up table, the control system 100 may interpolate between the two entries to determine the determined maximum consumption rate. In some examples, the mapping 610 may be stored in the form of a polynomial function, thereby potentially reducing the memory requirement of the mapping 610 compared with a look-up table. For example, the control system 100 may input the determined maximum consumption rate into the polynomial function to return the corresponding journey speed. As disclosed above, the mapping 610 may be determined based on simulation(s) of a model vehicle, lab testing of a production specification vehicle; and/or lab testing of the specific vehicle using the mapping 610.

Figure 7:
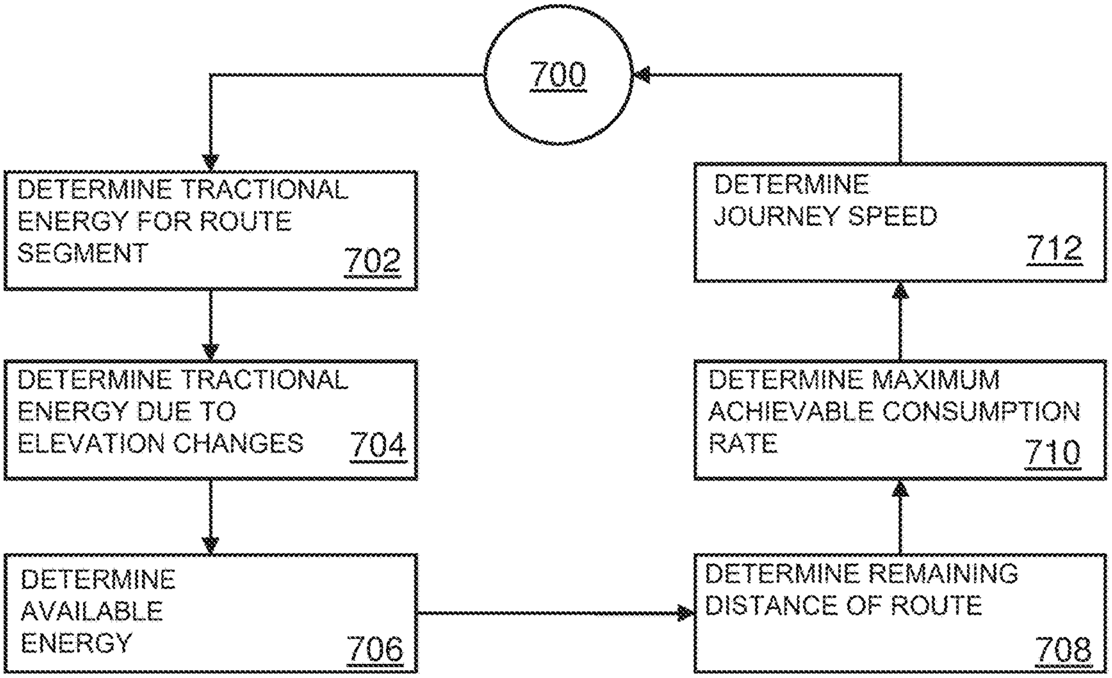
FIG. 7 shows a flow chart illustrating a method performed by a control system according to examples disclosed herein.

In some examples, determination of the journey speed may be performed before the vehicle commences travelling the route from the first location to the second location. In this way, the user of the vehicle may be aware of a maximum speed limit that they may adhere to in order to reach the second location with a vehicle SoC that is greater than the predetermined end-of-route SoC value and/or without requiring to charge the vehicle at a charging point. In some examples, determination of the journey speed may be performed while the vehicle is travelling the route from the first location to the second location. In this way, the vehicle may react to how the vehicle has been driven during the route. This example is illustrated in the method of FIG. 7. The method starts at step 700. At step 702, the control system 100 may determine, for all roads in the route where the flow speed of a route segment 406 is less than the lower journey speed bound value, the tractional energy associated with the relevant route segment 406 and add the determined tractional energy to a running total. At step 704, the control system 100 may determine, for all roads in the route where the flow sped is less than the lower journey speed bound value, the tractional energy due to elevation changes associated with the relevant route segments 406 and add the determined tractional energy to the running total. At step 706, the control system 100 may be arranged to determine the available energy based on the running total and the initial SoC 104*a* (i.e. the initial energy) of the power source of the vehicle. For all route segments 406, the control system 100 may determine the non-tractional energy and the energy required for a comfort level for each segment. At step 708, the control system 100 may be arranged to determine the remaining distance of the route using the total route distance (comprised within the route profile data 102) and the distance currently travelled by the vehicle. At step 710, the control system 100 may be arranged to determine the maximum consumption rate achievable by the vehicle based on the determined available energy and the remaining route distance. At step 712, the control system 100 may be arranged to determine the journey speed based on the relationship between the journey speed, the determined available energy and the remaining distance of the route (e.g. a lookup chart or polynomial of journey speed against consumption rate).

In some examples, the control system 100 may be arranged to compare the determined journey speed with a lower journey speed bound value for at least a part of the route. The “lower journey speed bound value” may be understood to be a minimum acceptable speed for the vehicle to travel the route. In some examples, the “lower journey speed bound value” may be understood as the minimum speed relative to a legal speed limit. For example, the lower journey speed bound value may be equal to the legal speed limit minus 10 miles per hour. In this way, the lower journey speed bound value may be different for different parts of a route (e.g. the legal speed limit may be 30 mph on a residential road and 70 mph on a dual-carriageway, thus the minimum acceptable speed for the user may be 20 mph and 60 mph, respectively). In some examples, the lower journey speed bound value may be set by: the user of the vehicle before or during travelling the route; the control system 100 before or during the route; and/or in accordance with a user profile (e.g. a user profile associated with a user that is identified to be driving and/or present in the vehicle).

In some examples, the control system 100 may determine that the determined journey speed is greater than or equal to the lower journey speed bound value for at least a part of the route and output the determined journey speed. In some examples, the control system 100 may output the determined journey speed along with an indication to add a charging stop to the route.

In some examples, the control system 100 may determine that the determined journey speed is less than the lower journey speed bound value for at least a part of the route. When the determined journey speed (which has been calculated because the destination SoC is less than the predetermined end-of-route SoC value) is determined to be less than the lower journey speed bound value for at least a part of the route, the control system 100 may be arranged to output an indication of insufficient remaining battery energy to perform the route. In some examples, the indication of insufficient remaining battery energy to perform the route comprises one or more of: an amended route to include one or more charging stops; a new route between the first location and the second location without any charging stops; and an indication that the vehicle requires charging before departing from the first location. The term “charging stop” may be understood to indicate a location where a user of a vehicle may stop their vehicle to charge the power source of their vehicle at a charging point (e.g. location to connect the power source of the vehicle to an external power source).

In some examples, when the determined journey speed is determined to be less than the lower journey speed bound value for at least a part of the route, the control system 100 may be arranged to determine an alternative journey speed for the vehicle that indicates an upper speed limit at which the vehicle may travel during the at least a portion of the route and reach the second location with a SoC value that is less than the predetermined end-of-route SoC value and greater than zero. In some examples, the control system 100 may be arranged to compare the alternative journey speed with the lower journey speed bound value, the outcome of which may be dealt with in the same way as described above for the initially determined journey speed. In this way, the control system 100 provides the user with the option to adhere to the predetermined end-of-route SoC value or not.

In some examples, when outputting an indication of an amended route, the control system 100 may be arranged to receive a user input indicative of a user input confirming selection of the amended route (i.e. the user may manually select the amended route to be travelled) before using the amended route to travel from the first location to the second location. In some examples, when outputting an indication of an amended route, the control system 100 may be arranged to automatically use the amended route to travel from the first location to the second location (i.e. the control system 100 may automatically add one or more charging point to the route from the first location to the second location).

Figure 8:
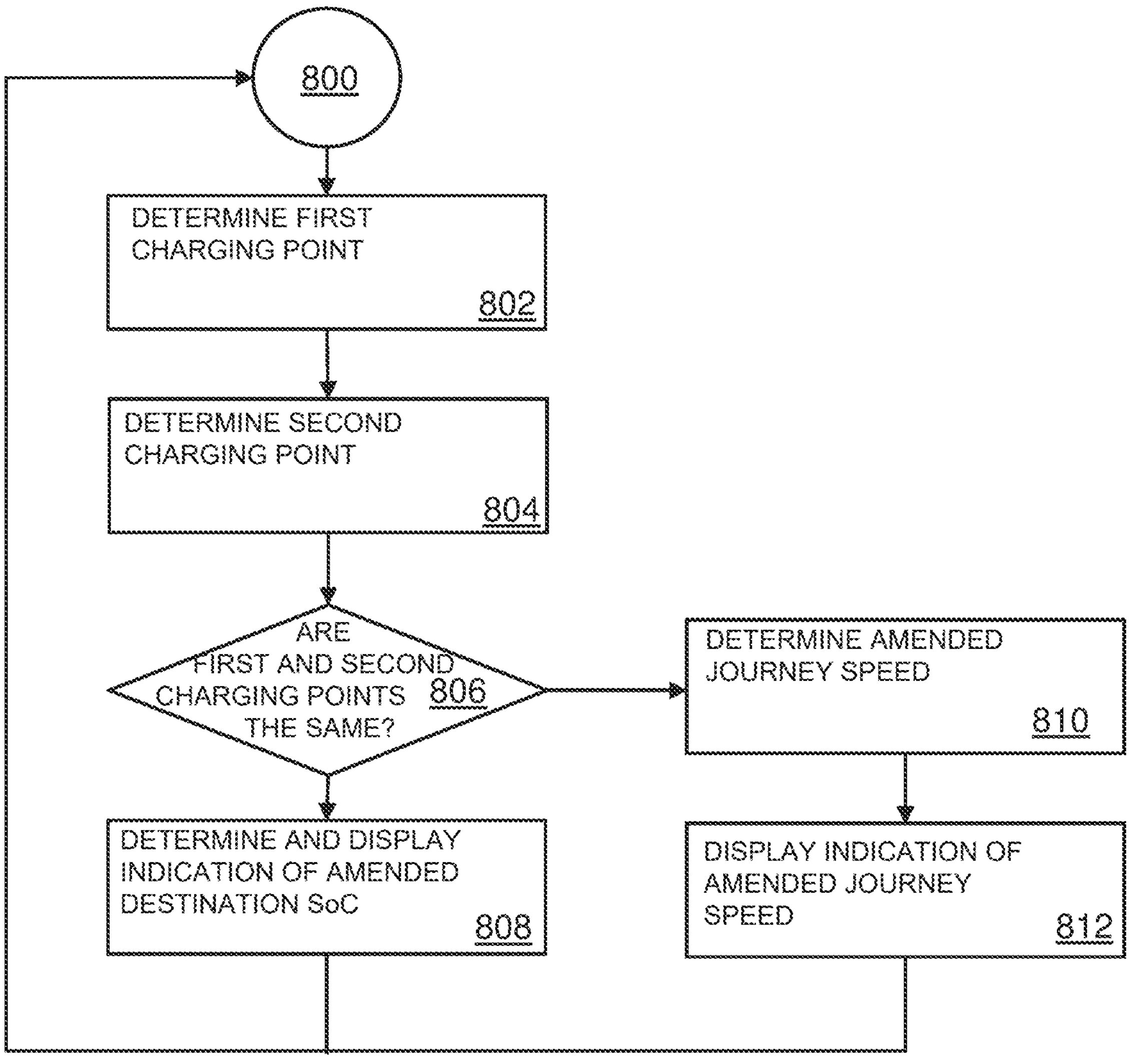
FIG. 8 shows a flow chart illustrating a method performed by a control system according to examples disclosed herein.

In some examples, when amending the route to include one or more charging stops, the control system 100 may be arranged to follow the method illustrated in FIG. 8, starting at step 800.

At step 802, the control system 100 may be arranged to determine a first charging point. The term "first charging point" may be understood to be a next charging point. In some examples, when determining the first charging point 802, the control system 100 may be arranged to determine the first charging point based on the predetermined end-of-route SoC value. For example, the control system 100 may be arranged to determine a charging point that the vehicle may reach (e.g. based on current vehicle usage and/or estimated usage using the route profile data 102 (i.e. using the flow speed)) with a SoC value that is closest to the predetermined end-of-route SoC value. For example, the control system 100, may determine an arrival SoC of the vehicle for one or more surrounding charging points and select the charging point for which the arrival SoC is closest to the predetermined end-of-route SoC value. In some examples, the control system 100 may be arranged to determine the charging point that the vehicle may reach with a SoC value that is closest to and greater than the predetermined end-of-route SoC value. In this way, the control system 100 attempts to ensure that a vehicle SoC value may not be less than the predetermined end-of-route SoC value.

At step 804, the control device may be arranged to determine a second charging point. The term "second charging point" may be understood to be a best alternative charging stop. In some examples, when determining the second charging point 804, the control system 100 may be arranged to determine the second charging point based on the lower journey speed bound value. For example, the control system 100 may be arranged to determine a charging point that the vehicle may reach (e.g. based on current vehicle usage and/or estimated usage using the route profile data 102 (i.e. using the flow speed)) with a SoC value that is closest to the predetermined end-of-route SoC value whilst using the lower journey speed bound value. For example, the control system 100 may determine the second charging point 804 based on the flow speed of the route profile data 102, wherein the flow speed may be capped at the lower journey speed bound value.

At step 806, the control system 100 may be arranged to determine whether the first charging point and the second charging point are the same charging point. In some examples, the control system 100 may determine whether the charging points are the same by comparing the geo-coordinates of the first charging point and the second charging point.

In some examples, if the first charging point is the same as the second charging point, the control system 100 may be arranged to amend the route profile data 102 to further comprise the first charging point. In some examples, if the first charging point is the same as the second charging point, the control system 100 may be arranged to determine an amended destination SoC and display an indication of the amended destination SoC 808. It may be understood that the term amended destination SoC may be a SoC value for the vehicle upon arriving at the first charging point (e.g. using the route profile data 102).

In some examples, if the first charging point is not the same as the second charging point, the control system 100 may be arranged to amend the route profile data 102 to further comprise the second charging point; and determine an amended journey speed for the vehicle using the amended route profile data. When determining the amended journey speed 810, the control system 100 may be arranged to employ the same method as described previously (e.g. using the method of FIG. 7). In some examples, the control system may be arranged to display an indication of the amended journey speed 812. In some examples, if the first charging point is not the same as the second charging point, the control system 100 may be arranged to output an indication of respective amended routes for the first and second charging points for selection by a user.

In some examples, the control system 100 may provide an indication of the determined charging point based on the determination. For example, the control system 100 may provide a notification on a display of the vehicle that may state how far away and/or how long it will take for the user to arrive at the determined charging point. In some examples, the indication of the determined charging point may be the dropping of a pin on a navigation map, displayed on the display of the vehicle.

In some examples, the control system 100 may be arranged to determine a second destination SoC based on the energy information 104 and the amended route profile data (i.e. comprising the first charging point or the second charging point). For example, the control system 100 may determine the second destination SoC in the same way as disclosed above. The control system 100 may be arranged to compare the second destination SoC with the predetermined end-of-route SoC value. In some examples, when the second destination SoC is less than the predetermined end-of-route SoC value, the control system 100 may be arranged to determine an alternative first charging point (e.g. based on the SoC value, as described above) and an alternative second charging point (e.g. based on the lower journey speed bound value, as described above). In some examples, the control system may then re-perform amending the route data with either the alternative first charging point or the alternative second charging point (e.g. as described above in relation to FIG. 8). The control system 100 may be arranged to re-perform the above steps until a second destination SoC based on the energy information 104 and the amended route profile data is greater than the predetermined end-of-route SoC value.

In some examples, when the destination SoC (or second destination SoC) is greater than or equal to the predetermined end-of-route SoC value and the determined journey speed is greater than or equal to the lower journey speed bound value, the control system 100 may be arranged to compare the route data with a route preference setting. It may be understood that the route preference setting may be a user setting indicating how the user would like to travel the route in the vehicle. That is, the route preference setting may allow the user to travel on the route in a way they would like to. For example, a user may prefer a route that has the shortest travelling distance, has the highest average speed, is the most eco-friendly, takes the shortest time to complete or similar. For example, an eco-friendly route may be a route with the lowest average speed and fewest charging stops while meeting the route constraints (e.g. meeting requirements for the minimum destination SoC value and the lower journey speed bound value). In some examples, the route preference setting may be stored in a storage in communication with the control system 100. In some examples, the control system 100 may be arranged to determine a route to travel from the first location to the second location based on the route preference setting. For example, if the route preference setting is set as "fastest", the control system 100 may be arranged to determine a route that has the shortest travel time for the vehicle to complete travelling the route. In some examples, the control system 100 may select the determined route from a plurality of routes between the first location and the second location, determined using the above-disclosed methods (e.g. the methods of FIG. 7 and FIG. 8), that each meet the route constraints.

In some examples, when the vehicle has commenced travelling the route, the control system 100 may be arranged to monitor progress of the vehicle travelling the route. In some examples, as the vehicle travels the route, the control system 100 may be arranged to determine whether the route has been completed (i.e. the vehicle has arrived at the second location) or whether the route has not been completed (i.e. the vehicle has not arrived at the second location). For example, the control system 100 may determine a location of the vehicle and compare the location of the vehicle to the location of the second location to determine whether they are the same.

In some examples, when the route has been completed, the control system 100 may output an end of guidance card. In some examples, the end of guidance card may comprise one or more of an offering of a parking search and a charging point search.

In some examples, when the route has not been completed, the control system 100 may be arranged to perform a recalculation. In some examples, the recalculation may be understood as the control system 100 recalculating the route from the current location of the vehicle (i.e. a first location) to the second location and determining the destination SoC based on the current location and the second location. That is, the control system 100 may be arranged to perform the steps relating to comparing the destination SoC to the predetermined end-of-route SoC value and determining the journey speed, and comparing the journey speed to the lower journey speed bound value (i.e. in relation to FIGS. 1-4 and 6-9). In some examples, the control system 100 may be arranged to perform the recalculation periodically, while the vehicle travels the route (e.g. recalculations for every unit of distance travelled or for every unit of time travelled). In this way, the output determine journey speed may be the most up to date and reliable in order to arrive at the second location with a SoC value that is equal to or greater than the predetermined end-of-route SoC value. In some examples, the control system 100 may be arranged to perform the recalculation when receiving an external recalculation trigger. In some examples, the external recalculation trigger may be caused by one or more of: a user input for recalculation and a vehicle location deviation. The term "vehicle location deviation" may be understood as the vehicle deviating from the route. For example, the control system 100 may determine that the current location of the vehicle is not a location included in the route and that, therefore, the vehicle is no longer following the route and, in response, the control system 100 may perform a recalculation of the route from the current location of the vehicle to the second location.

Figure 5:
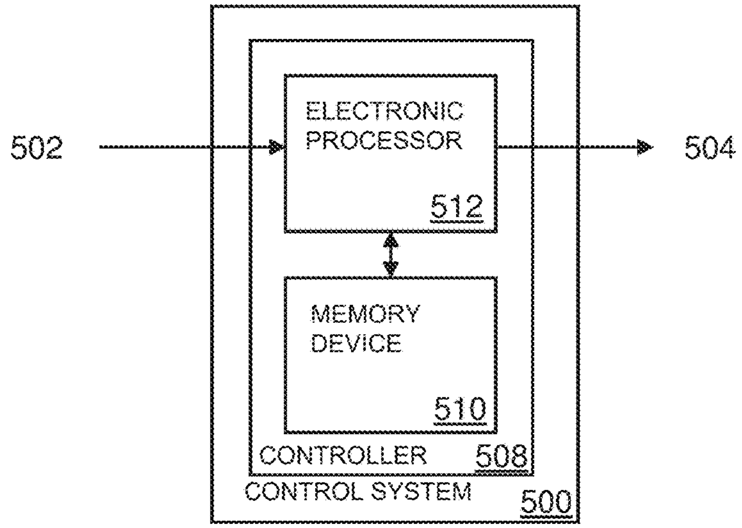
FIG. 5 shows an example of a simplified example of a control system such as may be adapted in according with an embodiment of the invention.

FIG. 5 shows a control system 500 which may be used to implement methods disclosed herein. The control system 500 may comprise one or more controllers 508. Each controller 508 comprises at least one electronic processor 512 having one or more electrical input(s) 502 for receiving one or more input signals, for example, route profile data 102 or energy information 104 of the vehicle, and one or more electrical output(s) 504, for outputting one or more output signal(s), for example, the determined journey speed 110 or energy requirement for route segments 310. Each controller 508 further comprises at least one memory device 510 electrically coupled to the at least one electronic processor 512 and having instructions stored therein. The at least one electronic processor 512 is configured to access the at least one memory device 510 and execute the instructions thereon so at to perform methods disclosed herein. For example, the at least one electronic processor is arranged to access the at least one memory device and execute the instructions thereon so as to: receive route profile data 102 indicative of a route between a first location and a second location; receive energy information 104 indicative of an initial State of Charge, SoC, 104*a* of a power source of the vehicle prior to the vehicle travelling the route; calculate, using the energy information 104 and the route profile data 102, a destination SoC of the power source of the vehicle at the second location; compare the destination SoC with a predetermined end-of-route SoC value; if the destination SoC is less than the predetermined end-of-route SoC value, determine a journey speed for the vehicle, the journey speed indicating an upper speed limit at which the vehicle may travel during at least a portion of the route and reach the second location with an SoC value equal to or greater than the predetermined end-of-route SoC value; and output the determined journey speed.

The electronic processor 512 may comprise any suitable electronic processor (e.g. a microprocessor, a microcontroller, an ASIC, etc.) that is configured to execute electronic instructions. The electronic memory device 510 may comprise any suitable memory device and may store a variety of data, information, threshold value(s), lookup tables or other data structures, and/or instructions therein or thereon. The memory device 510 may have information and instructions for software, firmware, programs, algorithms, scripts, applications, etc. stored therein or thereon that may govern all or part of the methodology described herein. Each electronic processor 512 may access the memory device 510 and execute and/or us that or those instructions and information to carry out or perform some or all of the functionality and methodology described herein.

The at least one memory device 510 may comprise a computer-readable storage medium (e.g. non-transitory, non-volatile or non-transient storage medium) that may comprise any mechanism for storing information in a form readable by a machine or electronic processors/computational devices, including, without limitation: a magnetic storage medium (e.g. floppy diskette); optical storage medium (e.g. CD-ROM); magneto optical storage medium; read only memory (ROM); random access memory (RAM); erasable programmable memory (e.g. EPROM ad EEPROM); flash memory; or electrical or other types of medium for storing such information/instructions.

Example controllers 508 have been described comprising at least one electronic processor 512 configured to execute electronic instructions stored within at least one memory device 510, which when executed causes the electronic processor(s) 512 to carry out the method as hereinbefore described. However, it is contemplated that the present invention is not limited to being implemented by way of programmable processing devices, and that at least some of, and in some embodiments all of, the functionality and or method steps of the present invention may equally be implemented by way of non-programmable hardware, such as by way of non-programmable ASIC, Boolean logic circuitry, etc.

Figure 9:
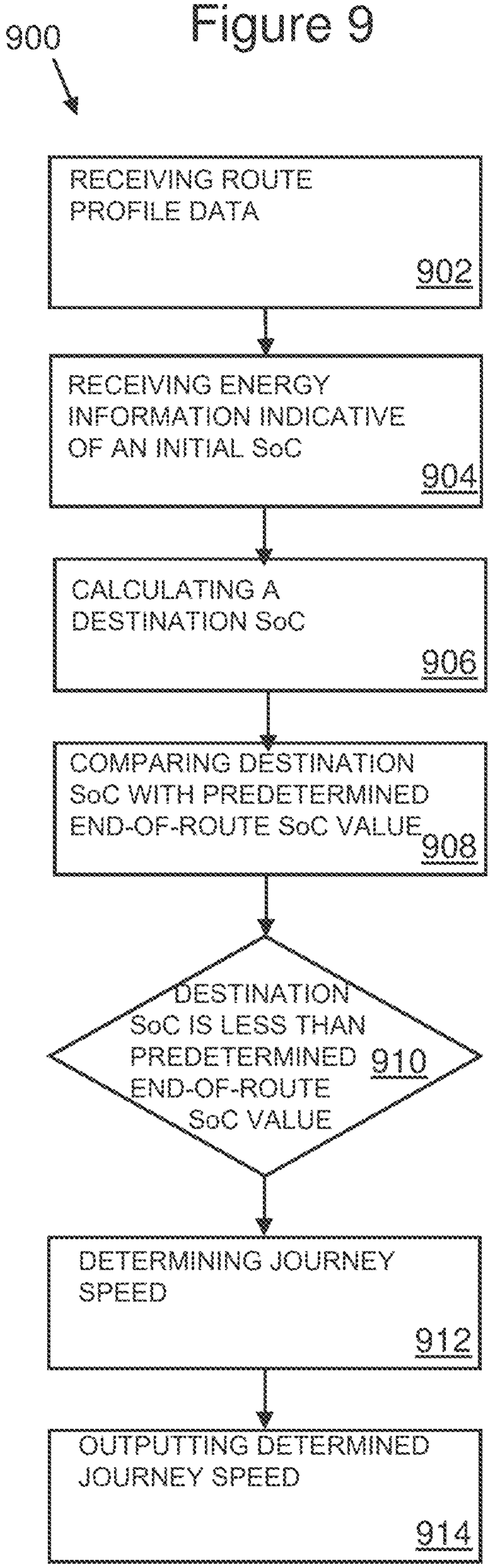
FIG. 9 shoes a flow chart illustrating a method of determining a journey speed according to examples disclosed herein.

FIG. 9 shows an example method 900 according to examples disclosed herein. The method 900 may performed by a control system 100, 500 as disclosed herein. The method 900 as illustrated comprises: receiving 902 route profile data 102 indicative of a route between a first location and a second location; receiving 904 energy information 104 indicative of an initial State of Charge, SoC, of a power source of a vehicle prior to the vehicle travelling the route; calculating 906, using the energy information 104 and the route profile data 102, a destination SoC of the power source of the vehicle at the second location; comparing 908 the destination SoC with an predetermined end-of-route SoC value; if the destination SoC is less than the predetermined end-of-route SoC value 910, determining 912 a journey speed for the vehicle, the journey speed indicating an upper speed limit at which the vehicle may travel during at least a portion of the route and reach the second location with an SoC value equal to or greater than the predetermined end-of-route SoC value; and outputting 914 the determined journey speed.

FIG. 10 shows an example vehicle 1000, comprising any control system 100, 500 as disclosed herein, or any non-transitory, computer-readable storage medium as disclosed herein. In some examples, the vehicle 1000 may be an electric vehicle with a battery as the power source. In some examples, the vehicle may be a hybrid vehicle with a battery and petrol or diesel engine as the power source.

Also encompassed in this disclosure is computer software (as an example of computer program code) that, when executed, is arranged to perform any method described herein, for example to control a laser welding system. The computer software may be stored in a micro-controller, firmware, and/or on a computer readable medium, and be therefore recorded on a non-transitory computer readable medium. That is, the computer software may be tangibly stored on a computer readable medium. It will be appreciated that examples of such computer program code may be realised in the form of hardware, software or a combination of hardware and software.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The claims are not restricted to the details of any foregoing examples. The claims cover and encompass any novel one, or any novel combination, of the features disclosed in this specification (including any accompanying claims, abstract and drawings), or to any novel one, or any novel combination, of the steps of any method or process so disclosed. The claims should not be construed to cover merely the foregoing examples, but also any examples which fall within the scope of the claims.

The invention claimed is:

1. A control system for a vehicle, the control system comprising one or more controllers, the one or more controllers including one or more electrical inputs for receiving route profile data and energy information of the vehicle, the control system including storage storing a vehicle-speed mapping, the control system arranged to:

receive the route profile data indicative of a route between a first location and a second location;

receive the energy information indicative of an initial State of Charge (SoC) of a power source of the vehicle prior to the vehicle travelling the route;

calculate, using the energy information and the route profile data, a destination SoC of the power source of the vehicle at the second location;

compare the destination SoC with a predetermined end-of-route SoC value;

if the destination SoC is less than the predetermined end-of-route SoC value, determine a journey speed for the vehicle, the journey speed indicating an upper speed limit at which the vehicle may travel during at least a portion of the route and reach the second location with a SoC value equal to or greater than the predetermined end-of-route SoC value, and output the determined journey speed to a display screen for visual display, wherein the journey speed is determined by:

determining an available energy of the power source based on the initial SoC and the route profile data;

determining a route distance based on the route profile data; and determining the journey speed by accessing the vehicle-speed mapping, the vehicle-speed mapping indicating a relationship between the journey speed, the available energy of the power source, and the route distance, periodically recalculate the journey speed while the vehicle travels the route based on a remaining distance of the route from a current location of the vehicle to the second location, such that the journey speed is a live updated journey speed; and if the destination SoC is less than the predetermined end-of-route SoC value and the determined journey speed is less than a lower journey speed bound value for at least a part of the route, output an indication of insufficient remaining battery energy to perform the route to the display screen for visual display, wherein determining the available energy comprises:

dividing the route profile data into a plurality of route segments;

for each route segment of the plurality of route segments, determining a tractional energy to travel the route segment, wherein the tractional energy is determined based on a speed energy and an elevation change energy associated with the route segment;

when a flow speed of a route segment is less than or equal to the lower journey speed bound value, adding the tractional energy due to the speed energy associated with the route segment to a running total of energy;

when the flow speed of a route segment is greater than the lower journey speed bound value, adding the tractional energy due to the elevation change energy associated with the route segment to the running total of energy; and determining the available energy of the power source based on the running total of energy and the initial SoC.

2. The control system of claim 1, wherein, when determining the available energy of the power source, the control system is arranged to:

for each route segment of the plurality of route segments, determine a non-tractional energy and an energy for a user-set comfort level for the route segment, and add the non-tractional energy and the energy for the user-set comfort level to the running total of energy.

3. The control system of claim 2, wherein the non-tractional energy is energy for the vehicle that is not for propelling the vehicle through a route segment, and wherein the energy for the user-set comfort level is energy to regulate an internal environment of the vehicle.

4. The control system of claim 1, wherein, when calculating the destination SoC, the control system is arranged to:

determine an expected tractional energy and an expected ancillary load for travelling the route, wherein the expected tractional energy is determined using a plurality of fragments of the route and an expected energy consumption of each fragment of the plurality of fragments, and wherein the expected energy consumption of each fragment is determined using one or more of: an average journey speed for each fragment, a time expected to travel each fragment, and an amount of ascent and descent for each fragment, wherein the destination SoC is calculated based on the expected tractional energy and the expected ancillary load for travelling the route.

5. The control system of claim 1, wherein the indication of insufficient remaining battery energy to perform the route comprises one or more of: an amended route to include one or more charging stops; a new route between the first location and the second location without any charging stops; and an indication that the vehicle requires charging before departing from the first location.

6. The control system of claim 5, wherein, when amending the route to include one or more charging stops, the control system is arranged to:

determine a first charging point based on the predetermined end-of-route SoC value;

determine a second charging point based on the lower journey speed bound value;

determine whether the first charging point and the second charging point are the same charging point; and provide an indication of the determined charging point based on the determination.

7. The control system of claim 6, wherein, if the first charging point is the same as the second charging point, the control system is arranged to:

amend the route profile data to further comprise the first charging point.

8. The control system of claim 7, wherein, the control system is arranged to:

determine a second destination SoC based on the energy information and the amended route profile data; and if the second destination SoC is less than the predetermined end-of-route SoC value, determine an alternative first charging point based on the predetermined end-of-route SoC value and an alternative second charging point based on the lower journey speed bound value.

9. The control system of claim 6, wherein, if the first charging point is not the same as the second charging point, the control system is arranged to:

amend the route profile data to further comprise the second charging point; and determine an amended journey speed for the vehicle using the amended route profile data.

10. The control system of claim 1, wherein the control system is arranged to:

if the destination SoC is greater than or equal to the predetermined end-of-route SoC value and the determined journey speed is greater than or equal to the lower journey speed bound value, compare the route data with a route preference setting; and determine a route to travel from the first location to the second location based on the route preference setting.

11. A vehicle comprising a control system, the control system comprising one or more controllers, the one or more controllers including one or more electrical inputs for receiving route profile data and energy information of the vehicle, the control system including storage storing a vehicle-speed mapping, the control system arranged to:

receive the route profile data indicative of a route between a first location and a second location;

receive the energy information indicative of an initial State of Charge (SoC) of a power source of the vehicle prior to the vehicle travelling the route;

calculate, using the energy information and the route profile data, a destination SoC of the power source of the vehicle at the second location;

compare the destination SoC with a predetermined end-of-route SoC value;

if the destination SoC is less than the predetermined end-of-route SoC value, determine a journey speed for the vehicle, the journey speed indicating an upper speed limit at which the vehicle may travel during at least a portion of the route and reach the second location with a SoC value equal to or greater than the predetermined end-of-route SoC value, and output the determined journey speed to a display screen for visual display, wherein the journey speed is determined by:

determining an available energy of the power source based on the initial SoC and the route profile data;

determining a route distance based on the route profile data; and determining the journey speed by accessing the vehicle-speed mapping, the vehicle-speed mapping indicating a relationship between the journey speed, the available energy of the power source, and the route distance, periodically recalculate the journey speed while the vehicle travels the route based on a remaining distance of the route from a current location of the vehicle to the second location, such that the journey speed is a live updated journey speed; and if the destination SoC is less than the predetermined end-of-route SoC value and the determined journey speed is less than a lower journey speed bound value for at least a part of the route, output an indication of insufficient remaining battery energy to perform the route to the display screen for visual display, wherein determining the available energy comprises:

dividing the route profile data into a plurality of route segments;

for each route segment of the plurality of route segments, determining a tractional energy to travel the route segment, wherein the tractional energy is determined based on a speed energy and an elevation change energy associated with the route segment;

when a flow speed of a route segment is less than or equal to the lower journey speed bound value, adding the tractional energy due to the speed energy associated with the route segment to a running total of energy;

when the flow speed of a route segment is greater than the lower journey speed bound value, adding the tractional energy due to the elevation change energy associated with the route segment to the running total of energy; and determining the available energy of the power source based on the running total of energy and the initial SoC.

12. A method executable by a control system, the control system comprising one or more controllers, the one or more controllers including one or more electrical inputs for receiving route profile data and energy information of the vehicle, the control system including storage storing a vehicle-speed mapping, the method comprising:

receiving the route profile data indicative of a route between a first location and a second location;

receiving the energy information indicative of an initial State of Charge (SoC) of a power source of a vehicle prior to the vehicle travelling the route;

calculating, using the energy information and the route profile data, a destination SoC of the power source of the vehicle at the second location;

comparing the destination SoC with a predetermined end-of-route SoC value;

if the destination SoC is less than the predetermined end-of-route SoC value, determining a journey speed for the vehicle, the journey speed indicating an upper speed limit at which the vehicle may travel during at least a portion of the route and reach the second location with an SoC value equal to or greater than the predetermined end-of-route SoC value, and outputting the determined journey speed to a display screen for visual display, wherein the journey speed is determined by:

determining an available energy of the power source based on the initial SoC and the route profile data;

determining a route distance based on the route profile data; and determining the journey speed by accessing the vehicle-speed mapping, the vehicle-speed mapping indicating a relationship between the journey speed, the available energy of the power source, and the route distance, periodically recalculating the journey speed while the vehicle travels the route based on a remaining distance of the route from a current location of the vehicle to the second location, such that the journey speed is a live updated journey speed; and if the destination SoC is less than the predetermined end-of-route SoC value and the determined journey speed is less than a lower journey speed bound value for at least a part of the route, outputting an indication of insufficient remaining battery energy to perform the route to the display screen for visual display, wherein determining the available energy comprises:

dividing the route profile data into a plurality of route segments;

for each route segment of the plurality of route segments, determining a tractional energy to travel the route segment, wherein the tractional energy is determined based on a speed energy and an elevation change energy associated with the route segment;

when a flow speed of a route segment is less than or equal to the lower journey speed bound value, adding the tractional energy due to the speed energy associated with the route segment to a running total of energy;

when the flow speed of a route segment is greater than the lower journey speed bound value, adding the tractional energy due to the elevation change energy associated with the route segment to the running total of energy; and determining the available energy of the power source based on the running total of energy and the initial SoC.

* * * * *